United States Patent
Deak

(10) Patent No.: US 6,946,302 B2
(45) Date of Patent: Sep. 20, 2005

(54) SYNTHETIC-FERRIMAGNET SENSE-LAYER FOR HIGH DENSITY MRAM APPLICATIONS

(75) Inventor: James G. Deak, Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 10/762,478

(22) Filed: Jan. 23, 2004

(65) Prior Publication Data

US 2004/0152218 A1 Aug. 5, 2004

Related U.S. Application Data

(62) Division of application No. 10/114,249, filed on Apr. 3, 2002, now Pat. No. 6,728,132.

(51) Int. Cl.[7] .............................................. H01L 21/00
(52) U.S. Cl. .......................................... 438/3; 438/241
(58) Field of Search ............................ 438/3, 238, 241, 438/381, 258

(56) References Cited

U.S. PATENT DOCUMENTS

| | | | |
|---|---|---|---|
| 5,173,873 A | 12/1992 | Wu et al. | |
| 5,650,958 A | 7/1997 | Gallagher et al. | |
| 5,764,567 A | * 6/1998 | Parkin .......................... | 365/173 |
| 5,768,181 A | 6/1998 | Zhu et al. | |
| 5,841,692 A | 11/1998 | Gallagher et al. | |
| 5,966,012 A | 10/1999 | Parkin | |
| 5,982,658 A | 11/1999 | Berg et al. | |
| 6,166,948 A | 12/2000 | Parkin et al. | |
| 6,219,212 B1 | 4/2001 | Gill et al. | |
| 6,233,172 B1 | * 5/2001 | Chen et al. .................. | 365/173 |
| 6,365,286 B1 | * 4/2002 | Inomata et al. .............. | 428/692 |
| 6,469,926 B1 | * 10/2002 | Chen .......................... | 365/158 |
| 6,750,068 B2 | * 6/2004 | Chen ............................. | 438/3 |

FOREIGN PATENT DOCUMENTS

EP 1 182 713 A2 2/2002

OTHER PUBLICATIONS

Two–Dimensional Magnetic Switching of Micron–Size Films in Magnetic Tunnel Junctions—Applied Physics Letters—Jan. 31, 2000, vol. 76, No. 5.

Layered Magnetic Structures; Facts, Figures, Future—Institute of Physics Publishing—Journal of Physics: Condensed Matter, vol. 13, pp. 7691–7706 (Aug. 27, 2001).

Dependence of Exchange Coupling on Antiferromagnetic Layer Thickness in NiFe/CoO Bilayers—Journal of Applied Physics, vol. 83, No. 11, pp. 6822–6824, Jun. 1, 1998.

* cited by examiner

Primary Examiner—David Nhu
(74) Attorney, Agent, or Firm—Dickstein Shapiro Morin & Oshinsky LLP

(57) ABSTRACT

An improved magnetic memory element is provided in which a magnetic sense layer is formed of two ferromagnetic material layers separated by a spacer layer. The two ferromagnetic layers are formed as a synthetic ferrimagnet with stray field coupling and antiferromagnetic exchange coupling across the spacer layer.

34 Claims, 11 Drawing Sheets

SYNTHETIC-FERRIMAGNET SENSE-LAYER FOR HIGH DENSITY MRAM APPLICATIONS

This application is a divisional application of U.S. patent application Ser. No. 10/114,249, filed on Apr. 3, 2002 now U.S. Pat. No. 6,728,132, the entirety of which is incorporated herein by reference.

FIELD OF THE INVENTION

This invention relates generally to the field of nonvolatile memory devices for use as computer storage, and in particular to nonvolatile memory arrays that use magnetic memory elements as the individual data bits.

BACKGROUND OF THE INVENTION

Integrated circuit designers have always sought the ideal semiconductor memory: a device that can be randomly accessed, written or read very quickly, is non-volatile but indefinitely alterable, and consumes little power. Magnetic Random Access Memory (MRAM) technology has been increasingly viewed as offering many of these advantages.

An MRAM device typically includes an array of magnetic memory elements 11 located at the intersections of row line 13 and column line 15 conductors as illustrated in FIG. 1. A simple magnetic memory element has a structure which is shown in more detail in FIG. 2. The magnetic memory element includes ferromagnetic layers 17 and 19 separated by a nonmagnetic layer 21. The magnetization in one ferromagnetic layer 17, typically referred to as the pinned layer, is fixed in one direction. The magnetization of the other ferromagnetic layer 19, often referred to as the sense layer, is not pinned, so its magnetization is free to switch between "parallel" and "anti-parallel" states relative to the magnetization of the pinned layer. The sense layer may also be referred to as the "free" layer or storage layer, thus it should be understood that when the term "sense layer" is used, the meaning of this term should not be limited to this terminology but rather the function the layer performs.

The logical value or bit stored in an MRAM memory element is associated with a resistance value, and the resistance of the memory element is determined by the relative orientation of the sense layer magnetization with respect to the pinned layer magnetization orientation. A parallel orientation of the magnetization of the sense layer with respect to the pinned layer magnetization results in a low resistance. Conversely, in response to the anti-parallel orientation, the magnetic memory element will show a high resistance. Referring to FIG. 2, the manner in which the resistance of the memory element is read is dependent on the type of material used to form the nonmagnetic spacer layer 21 separating the pinned layer 17 from the sense layer 19. If the nonmagnetic spacer layer 21 is made from a conducting material, such as copper, then the resistance value of the memory element can be sensed via the giant magnetoresistance effect, which usually involves running a current parallel to the long axis 20 of the memory element. If the nonmagnetic spacer layer is composed of an insulating material, such as alumina, then the resistance value can be sensed using the tunneling magnetoresistance effect, and this is accomplished by running a current perpendicular to the plane of the nonmagnetic spacer layer 21 from the sense layer 19 to the pinned layer 17.

A logical "0" or "1" is usually written into the magnetic memory element by applying external magnetic fields (via an electrical current) that rotate the magnetization direction of the sense layer. Typically an MRAM memory element is designed so that the magnetization of the sense layer and the pinned layer aligns along an axis known as the easy axis 27. External magnetic fields are applied to flip the orientation of the sense layer along its easy axis to either the parallel or anti-parallel orientation with respect to the orientation of the magnetization of the pinned layer, depending on the logic state to be stored.

MRAM devices typically include an orthogonal array of row and column lines (electrical conductors) that are used to apply external magnetic fields to the magnetic memory elements during writing and may also be used to sense the resistance of a memory element during reading. Additional write and read conductors may also be present in the array. In the two conductor level implementation shown in FIG. 1, the magnetic memory elements are located at the intersections of the row 13 and column 15 lines.

Referring to FIG. 1, the magnetic field that is generated by running a current through the column line 15 is referred to herein as the easy-axis write field. The easy-axis write field is collinear with the easy axis 23 of the MRAM bit 11 (FIG. 2a). The magnetic field that is generated when a current is run through the row conductive line 13 is referred to as the hard-axis write field. The hard-axis write field generated by the row conductive line 13 runs parallel to the hard axis 25 of the MRAM bit 11.

A memory element is selected for writing when it is exposed to both a hard-axis and an easy-axis write field. Each write field, by itself and when generated with only one of the two conductive lines, is therefore commonly referred to as a half-select field because a single field by itself should not be of sufficient magnitude to switch the magnetization orientation of the sense layer of a memory element. In practice, however, the hard-axis write field is often referred to as the half-select field, while the easy-axis write field is often referred to as the switching field. These two fields are used to perform write operations on a specific memory element when applied in conjunction with each other by passing current through conductors 13, 15 (FIG. 1) intersecting at the selected element. The bit stored at the selected memory element being accessed for a read or write operation is referred to herein as a "selected bit".

This method for selecting a bit for writing is not ideal. During a write operation, the unselected memory elements coupled to the particular column line 15 are exposed to the easy-axis write field. Similarly, the unselected memory elements 11 coupled to the particular row line 13 are exposed to the hard-axis write field. It is thus important to limit stray magnetic fields in the array of MRAM memory elements to a value that cannot cause half-selected bits to be written. Some sources of stray fields include fields from neighboring write conductors, stray fields emanating from the ferromagnetic layers of neighboring memory elements, and fields generated by sources external to the MRAM device. These stray fields may also inhibit a selected memory element from being written, if the combined value of the stray, hard-axis, and easy-axis fields is too small for a bit to be written. Another source of non-ideal behavior that manifests itself in the write current required to write a memory element results from the difficulty in making an array of MRAM memory elements that respond identically to the applied write fields. Some sources of this effect include variations in element-to-element geometry, variations in element-to-element magnetic properties, and thermally activated magnetization fluctuations. Therefore, the particular value of the hard and easy-axis write fields, and thus the row and column line write currents, is a compromise such that selected memory elements are selected with enough margin that they are always written and unselected memory elements are never exposed to a field large enough that they are unintentionally written.

Thermal effects, such as superparamagnetism or thermally activated magnetization reversal, and the effect of stray fields emanating from neighboring bits may cause problems in MRAM devices. Either of these of these mechanisms can result in unpredictable write and read behavior. Using a conventional single-layer sense layer, these effects will be extremely difficult to overcome as the bit density of the MRAM device is increased.

Thermal fluctuation in a seemingly unfluctuating macroscopic observable quantity, such as the magnetization of a ferromagnetic material, is an abstract concept. The orientation and magnitude of the magnetization of a ferromagnetic material are in actuality statistical quantities. In any material, fluctuations in thermal energy are continually occurring on a microscopic scale, where the magnitude of the thermal fluctuations is determined by the temperature T of the material. These fluctuations when averaged over the entire volume of the specimen in question determine the macroscopically observable property of the system. On a microscopic level, the probability for any atom in a ferromagnetic material to have a magnetic moment oriented in a particular direction is proportional to the Boltzmann factor, $e^{-U/K_bT}$. Here, U is the energy associated with, in this case, a particular magnetic moment orientation and $K_b$ is Boltzman's constant. As the energy of a particular atomic moment orientation decreases, or as T and thus the thermal energy increases, the likelihood of an atom having a moment oriented in a particular direction for a fixed period of time decreases. If the ratio of $U/K_bT$ becomes small enough, the magnetic moment of the atom will spontaneously change direction under the influence of thermal fluctuations. The sense layer of an MRAM memory element may be thought of as a collection of atomic magnetic moments or spins that are tightly coupled together and aligned in the same direction. The energy required to orient the magnetization of the sense layer can thus be considered as the product of some energy density times the volume of the sense layer, $U_{sw}=U_pV$. As the temperature increases or as the sense layer volume decreases, the likelihood of the sense layer to be found in a particular orientation decreases. Again, if $U_{sw}/K_bT$ is small, the orientation of the sense layer's magnetization is unstable to thermal fluctuations. Memory bits that are characterized by low values of $U_{sw}/K_bT$ tend to have poor data retention times. Wait long enough and a fluctuation can spontaneously reverse the magnetization. A magnetic memory element that can spontaneously reverse its magnetization on a time scale short compared to the required data retention time is said to have hit the superparamagnetic limit. As the superparamagnetic limit is approached, magnetic memory elements also become more susceptible to half-select write events or the occasional inability to write a selected memory element, as a thermal fluctuation may inhibit a bit from writing in a specified time interval, or it may write a half-selected bit in a specified time interval. Note that increasing MRAM memory density necessitates a decrease in the volume of an MRAM bit and thus pushes the technology closer to the superparamagnetic limit or to the regime where thermal fluctuation becomes a problem.

Conventional MRAM memory elements also suffer from inter-bit interactions resulting from stray magnetic fields that emanate from the magnetic memory element 11 sense layers. The sense layer of an MRAM memory element 11 produces stray fields because it is not a closed magnetic flux structure. It thus forms poles at the edges of the sense layer in response to the orientation of the sense layer magnetization. The orientation of the stray field therefore changes with the orientation of the magnetization of a sense layer in a memory element. The stray fields produced by these poles decrease in value with increasing distance from the sense layer. At any memory element in an MRAM array, the stray fields from the neighboring bits may, however, be significant compared to the field required to switch the bit. In future MRAM designs, memory elements will need to be packed together more closely, which will compound this problem. A need therefore exists to reduce the stray fields produced by the magnetic layers in an MRAM memory element and reduce memory element sensitivity to thermal fluctuations.

SUMMARY OF THE INVENTION

The present invention provides a method and apparatus, which minimizes problems associated with increased MRAM memory density due to thermal fluctuation instability and stray field interactions, through the use of an improved sense layer. The proposed stack of the modified MRAM bit 11 is constructed with a synthetic ferrimagnet as the sense layer. The sense layer is designed so that the synthetic ferrimagnet's ferromagnetic layers are both stray field coupled and antiferromagnetically exchange coupled via an RKKY interaction through a spacer layer composed of a metallic compound, such as Ru or Cu.

BRIEF DESCRIPTION OF THE DRAWINGS

These and other features and advantages of the invention will be better understood from the following detailed description, which is provided in connection with the accompanying drawings.

DETAILED DESCRIPTION OF THE INVENTION

Figure 1:
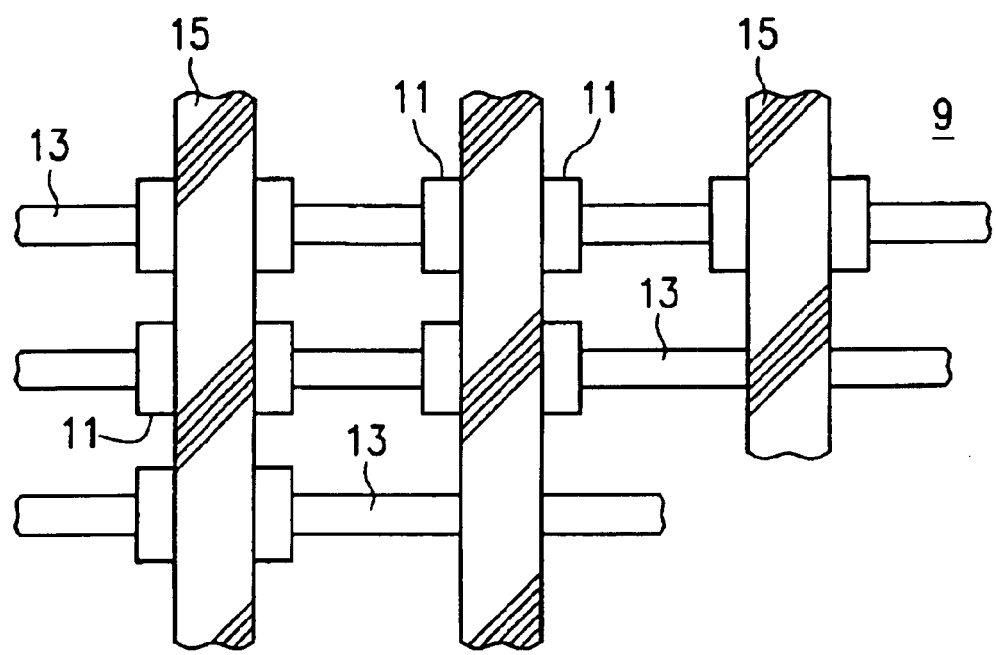
FIG. 1 shows a top section view of a portion of an array of magnetic memory elements in an MRAM magnetic memory device.

Referring to the drawings, FIG. 1 illustrates a top view of a simplified portion of an array 9 of magnetic tunnel junction memory elements 11. A plurality of column conductive lines 15, also called column lines, is each respectively formed over a plurality of memory elements 11 in each column of the array 9. A plurality of row conductive lines 13, also called a row lines, is each respectively formed beneath the memory elements 11 in each row of the array 9. The row lines 13 supply the hard-axis magnetic field, also known as a half-select field to the memory elements 11, while the column lines 15 supply the easy-axis switching field to the memory elements 11. Thus, to write to a particular memory element 11 requires signals on both lines 13 and 15 for the selected memory element 11. The row 13 and column 15 lines can also be used to read magnetic memory elements 11 in addition to writing the memory elements 11.

As is well known, the array 9 can also be constructed with row line 13 above and the column line 15 below each memory element 11. Although FIG. 1 depicts one arrangement for an MRAM array, others are also possible. Also, a plurality of arrays 9 of memory elements 11 may be provided in an MRAM memory device stacked one over the other. Also, reading of the magnetic memory elements 11 can be accomplished using a variety of conductors as well as conductor arrangements including additional or different conductors situated above, below or in the same layer as the sense layer.

Figure 2A:
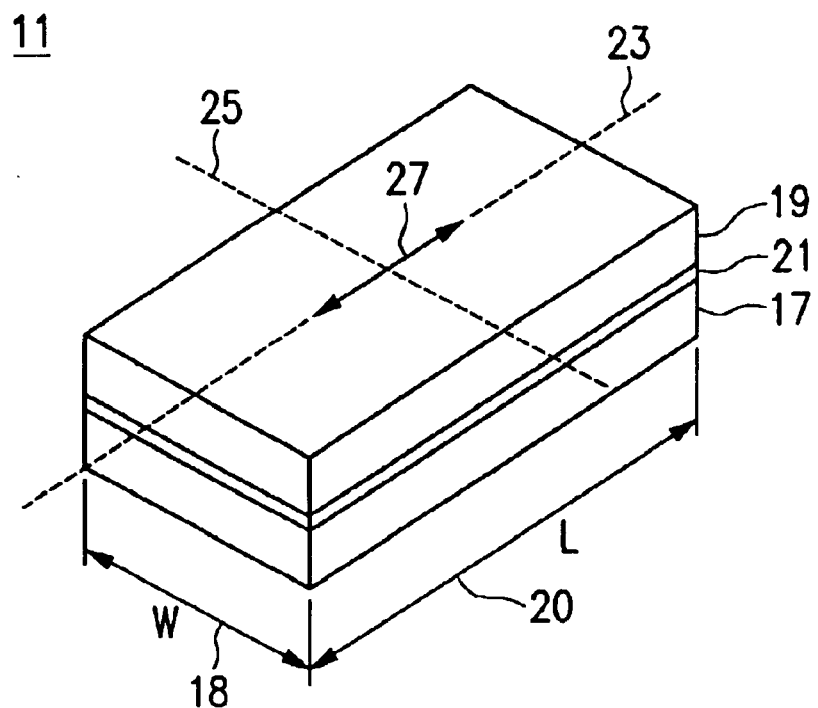
FIG. 2a shows a perspective view of a simplified FIG. 1 magnetic memory bit.

FIG. 2a shows a perspective view of a magnetic tunnel junction memory bit 11, which is simplified for illustration purposes. A first ferromagnetic layer 17, formed of a plurality of stacked thin magnetic layers, and a second ferromagnetic layer 19, formed of another plurality of stacked thin magnetic layers, are formed with an insulating non-magnetic spacer layer 21 such as alumina between them. The width (W) of the memory element 18 is defined as the distance along the hard-axis 25 of the memory element's sense layer. The length (L) of the memory element 20 is defined as the distance along the easy magnetic axis 23 of the memory element's sense layer. The length (L) dimension 20 of the memory element 11 is normally larger than the memory element's width dimension (W) 18. The aspect ratio of the sense layer may be defined as L/W. The sense layer 19 is manufactured to have a preferred axis for the two equilibrium magnetization moment orientations 27 of the sense layer 19 in the absence of an applied magnetic field (H). There are two possible directions of the magnetization of the sense layer 19 along the easy-axis 23, which defines the two magnetic moment states 27 of the sense layer 19. In contrast, the pinned layer 17 may be fabricated to only have one equilibrium or preferred magnetic moment direction of magnetization and this direction is usually parallel to the easy axis 23 of the sense layer 19. The magnetic moment 27 of the sense layer 17 prefers to align along the L dimension 20, or easy axis 23, of the magnetic memory element 11.

Figure 2B:
FIG. 2b shows a top view of a magnetic memory bit constructed in accordance with an exemplary embodiment of the invention.

While FIGS. 1 and 2a show a memory element 11 which is rectangular in shape, it must be understood that the memory elements 11 may be formed in any desired shape, including in an ellipsoid shape, such as shown in FIG. 2b. Bit shapes other than a rectangle may be used to improve the magnetic characteristics of an array of memory elements. This invention is applicable to memory elements of various shapes, and is thus not restricted to the rectangular bit shape shown in FIG. 2a.

Figure 3:
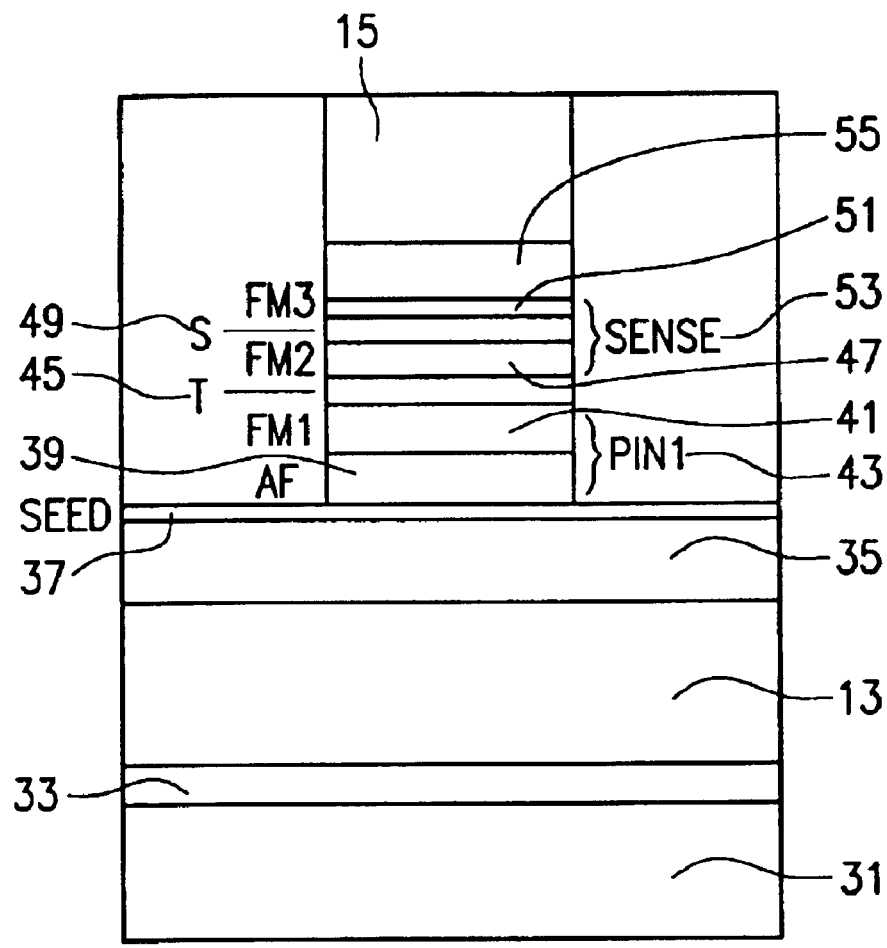
FIG. 3 shows a cross section view of a magnetic memory element constructed in accordance with an exemplary embodiment of the invention.

FIG. 3 shows an exemplary improved magnetic tunnel junction memory element stack 11 constructed in accordance with the invention. The memory element 11 is formed of a series of layers of materials formed one on top of the other between a word line conductor 13 and a column line conductor 15. The magnetic tunnel junction stack of FIG. 3 from bottom to top comprises a substrate 31, an insulator layer 33, the non-ferromagnetic metal conductive row line 13, a non-magnetic metal layer 35, a seed layer 37 for growth of an antiferromagnetic (AF) material layer 39, a first ferromagnetic layer 41, the antiferromagnetic layer 39 and first ferromagnetic layers 41 comprising a pinned layer 43, a non-magnetic tunnel barrier layer 45, a second ferromagnetic layer 47, a conductive spacer layer 49, a third ferromagnetic layer 51, a non-ferromagnetic metal layer 55, and the conductive column line 15. A synthetic ferrimagnet is provided as sense layer 53 comprising the second ferromagnetic layer 47, spacer layer 49 and third ferromagnetic layer 51. The second ferromagnetic layer 47, spacer layer 49 and the third ferromagnetic layer 51 are constructed so that the second ferromagnetic layer 47 and the third ferromagnetic layer 51 are both antiferromagnetically exchange coupled via an RKKY interaction through the conductive spacer layer 49 and stray field coupled as further explained below. RKKY interaction, also known as the Ruderman-Kittel-Kasuya-Yosida theory, is a model of effective interaction of spins in a metal.

The terms ferromagnetic, antiferromagnetic, ferrimagnetic, and paramagnetic need to be described in more detail. A ferromagnetic material can be considered to be a material composed of atoms, with magnetic moments or more accurately, "spins", that tend to align parallel to each other in equilibrium. Because the spins of the atoms align parallel to each other, the material has what is known as a spontaneous magnetization, that is, it has a net magnetic moment in the absence of an applied field. This is strictly only true on small length scales. When ferromagnetic substances are large enough, they break up into magnetic domains which reduces the energy associated with stray fields emanating from the material and is thus energetically favorable. Note that in order for the spins of neighboring atoms in a material to align parallel to each other there must be some sort of interaction between the atoms. This interaction is a quantum mechanical effect, known as exchange interaction. The exchange interaction alternatively may be described in terms of an exchange field. For the purpose of this disclosure, a positive value of the exchange field denotes a ferromagnetic coupling between neighboring spins. Some common ferromagnetic materials include the elements Ni, Fe, and Co, and various alloys, the most common of which is NiFe.

Antiferromagnetism is type of magnetism in solids, such as manganese oxide (MnO) in which adjacent ions that behave as tiny magnets (e.g. manganese ions, Mn2+) spontaneously align themselves at relatively low temperatures into opposite, or antiparallel, arrangements throughout the material so that the material exhibits almost no gross external magnetism. In antiferromagnetic materials, which include certain metals and alloys in addition to some ionic solids, the magnetism from magnetic atoms or ions oriented in one direction is canceled out by the set of magnetic atoms or ions that are aligned in the opposite direction. For the purpose of this invention, antiferromagnetic exchange coupling will denote a negative value of the exchange field. Antiferromagnetic materials are known and can be constructed or found in nature. Examples of relevant antiferromagnetic materials that are often used to pin the pinned layer of an MRAM memory element include FeMn, NiMn, PtMn, and IrMn.

A simple ferrimagnetic material would be one which is composed of magnetic atoms with different spin values on intermeshing arrays. The exchange coupling between neighboring atoms is antiferromagnetic so that the different sub lattices are oriented in opposite directions. Because the spins associated with the different sub lattices are different, a net magnetization exists in equilibrium. Ferrimagnets thus can exhibit a spontaneous magnetization. The most commonly observed class of materials that are ferrimagnets are ferrites.

A paramagnet is a magnetic material where thermal fluctuation energy is so strong that it overwhelms the exchange interaction between neighboring spins. In these materials, the random orientation of the atomic spins results in zero net magnetization in the absence of an applied magnetic field. When a magnetic field is applied to these materials, it becomes more probable for some fraction of the spins to align parallel to the applied field. As the applied field is increased, the magnetization of the paramagnet increases. Common paramagnetic materials include Al and K. Note also that ferromagnetic materials become paramagnetic at high temperatures, where the effect of thermal fluctuation overwhelms the exchange interaction. This temperature is known as the Curie temperature.

Two ferromagnetic layers can be exchange coupled to each other through a non-ferromagnetic material, and this effect is of great importance in MRAM technology. Two ferromagnetic layers can be antiferromagnetically coupled, that is forced to align in opposite directions, by stacking one layer, e.g. the third ferromagnetic layer 51, on top of the other layer, e.g. the second ferromagnetic layer 47, with a thin conductive spacer layer, e.g. layer 49, between the two layers 47, 51. The stack of two antiferromagnetically coupled ferromagnetic layers is often referred to as a synthetic ferrimagnet if the net moment of ferromagnetic layers does not cancel and as a synthetic antiferromagnet if the net moment of the stack is zero.

The relevant exchange coupling occurring across the conducting spacer layer 49 is antiferromagnetic and is often called RKKY coupling. The Ruderman-Kittel-Yasuya-Yoshida (RKKY) interaction between localized magnetic moments is an exchange interaction mediated by conduction electrons of a host metal. In general, this exchange coupling decreases in magnitude and oscillates between ferromagnetic coupling and antiferromagnetic coupling with increasing spacer layer 49 thickness. The oscillation of the magnetic coupling between ferromagnetic and antiferromagnetic alignment, as a function of interlayer thickness, is a general phenomenon of transition metal ferromagnets separated by a nonmagnetic conductive interlayer.

The spacer layer, e.g. 49, of a synthetic ferrimagnet or antiferromagnet must be of suitable thickness and composed of a suitable material (e.g. Ru Cu, or various alloys) so that the exchange coupling produced between the two ferromagnetic layers is antiferromagnetic and of the desired magnitude. Two mechanisms for antiferromagnetic coupling are used in this invention. They are stray field coupling, which is a result of the fields emanating from the edges of layers 47 and 51, and exchange coupling, which is an interaction that occurs through the spacer layer 49. For all intents and purposes, stray field coupling is not relevant until the magnetic memory element has been patterned. Exchange coupling through the spacer layer 49, exists immediately after the magnetic films are deposited. Stray field coupling is dependent on magnetic memory element size, and the exchange coupling through the spacer layer 49 is independent of the memory element's L and W dimensions.

Figure 4:
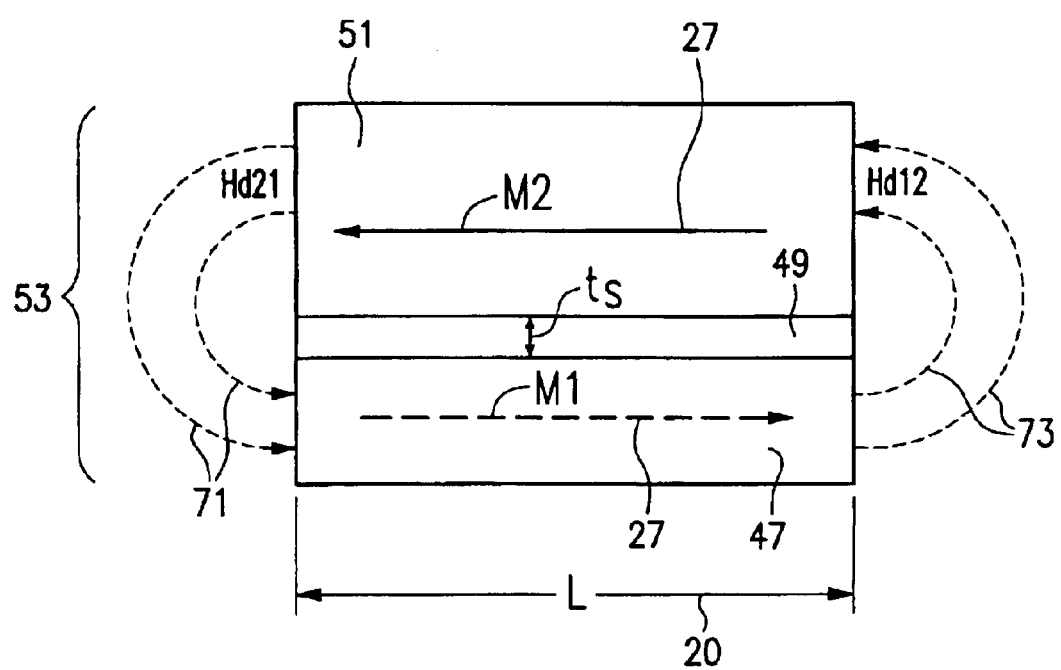
FIG. 4 shows a cross section view of a magnetic memory element sense layer constructed in accordance with an exemplary embodiment of the invention displaying magnetic field and magnetic moment attributes.

FIG. 4 shows a schematic representation of a cross-section of a synthetic ferrimagnetic sense layer portion 53 of an MRAM device, which will be used to define dimensions and parameters essential for describing the invention. The synthetic ferrimagnetic sense layer 53, is composed of two ferromagnetic layers 47 and 51, separated by a conducting metal spacer 49, that is neither ferromagnetic nor antiferromagnetic. The three layers of the synthetic ferrimagnetic sense layer 53 are patterned into a shape with a length L and width W. It is assumed for the purpose of disclosing the synthetic ferrimagnetic sense layer that the shape is an ellipse, but it need not be restricted to an ellipse in order to practice the invention. Layer 47 is composed of a ferromagnetic material with magnetization M1, saturation magnetization Msat1, and a thickness t1 such that if layer 47 was magnetically isolated from the rest of the stack, it would have a coercivity of Hc1. In the absence of an applied magnetic field, M1 will orient in one of two possible directions along an easy axis. Likewise, layer 51 is composed of a ferromagnetic material with magnetization M2, saturation magnetization Msat2 and thickness t2, such that if layer 51 was magnetically isolated from the stack, it would have a coercivity of Hc2. In the absence of an external magnetic field, M2 will orient along an easy axis in one of two possible directions. Because layer 47 is patterned into a shape of finite spatial extent, it produces a stray magnetic field 73 that passes through the volume of layer 51. The stray magnetic field 73 is defined as Hdl2. Within the volume of layer 51, Hdl2 points in a direction opposite to the direction of M1. Layer 51 being similarly patterned into a shape of finite spatial extent also produces a stray magnetic field 71 that passes through the volume of layer 47. The stray magnetic field 71 is defined as Hd21. Within the volume of layer 47, Hd21 points in a direction opposite to the orientation of M2. If composed of an appropriate material and deposited with thickness, ts, the spacer layer 49 will mediate an antiferromagnetic exchange coupling between ferromagnetic layers 47 and 51. For simplicity, the exchange coupling is represented as a magnetic field that is of the same magnitude, Hexc, in layers 47 and 51. This definition of the exchange field is for illustrative purposes only, and the invention is not intended to be restricted to a case of equal exchange field magnitude in layers 47 and 51. The exchange field Hexc is intended to be antiferromagnetic. Therefore in layer 47, Hexc will point in a direction opposite to M2, and the exchange field in layer 51 will point in a direction opposite to M1.

In order to build a synthetic ferrimagnetic sense layer and realize its benefits, which include decreased inter-bit interactions and improved thermal stability, two conditions must be obeyed. First, $$Msat1*t1 \neq Msat2*t2,$$

which ensures that there is sufficient net moment in the sense layer that it can be written at a reasonable write field value. Second, M1 must remain oppositely oriented to M2 at all times. In a real device, however, there will be some deviation from colinearity, the greater the deviation from colinearity, the poorer the device performance. In order for M1 and M2 to remain oppositely oriented the stray fields Hdl2 and Hd21, and exchange field Hexc must be set so that the antiferromagnetic orientation between M1 and M2 is stable under all operating conditions. The designer of a synthetic ferrimagnetic sense layer thus has to properly select the appropriate combinations of the parameters Msat1, Msat2, t1, t2, ts, Hc1, Hc2, and the spacer material in order to build a robust device. The inclusion of Hexc provides more flexibility in device design than the use of stray field coupling alone would provide. In particular, Hexc allows the designer more freedom in choosing t1, t2, and bit shape than would be possible using only Hdl2 and Hd21 to produce antiferromagnetic coupling between layers 47 and 51.

An embodiment of the invention can also be implemented using giant magnetoresistive (GMR) sensors. In a GMR sensor, the insulating tunnel barrier 45 will be replaced with a conductor such as copper. Writing would be performed in exactly the same manner that is performed for MRAM bits 11 using a TMR sense layer 53, but reading would be performed by running a current parallel to the plane of the bit 11 (as opposed to perpendicular as in the TMR MRAM bit 11 case). A different arrangement of row 13 and column 15 conductive lines or additional conductive lines may be required to read a MRAM bit with a GMR sensor.

Figure 5A:
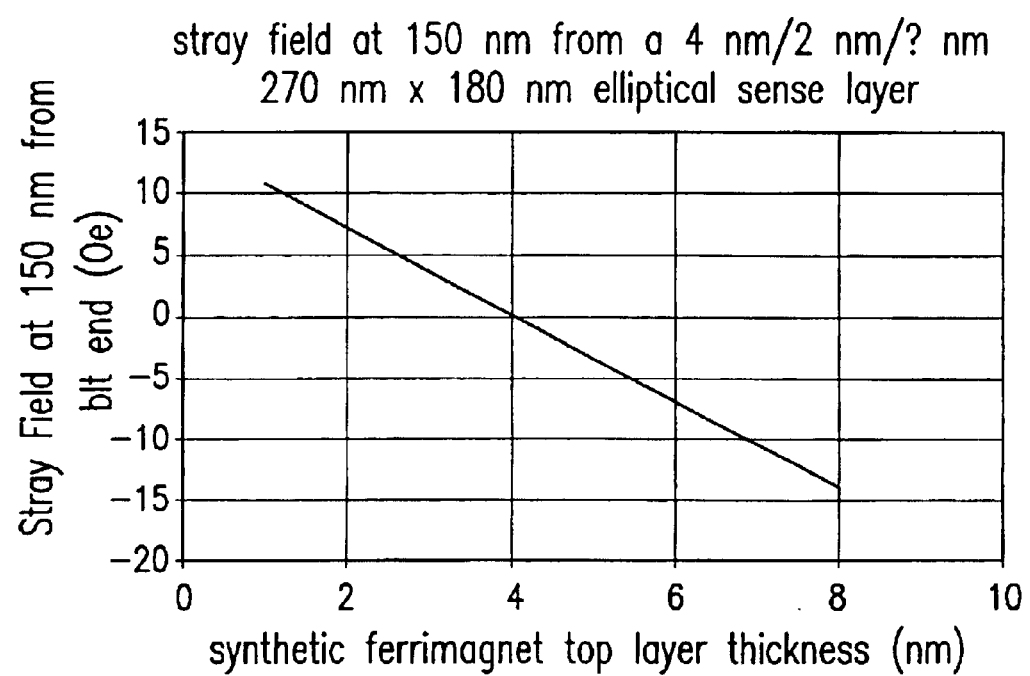
FIG. 5a shows the relationship between stray field and synthetic ferrimagnet top layer thickness for an exemplary embodiment of the invention.
Figure 5B:
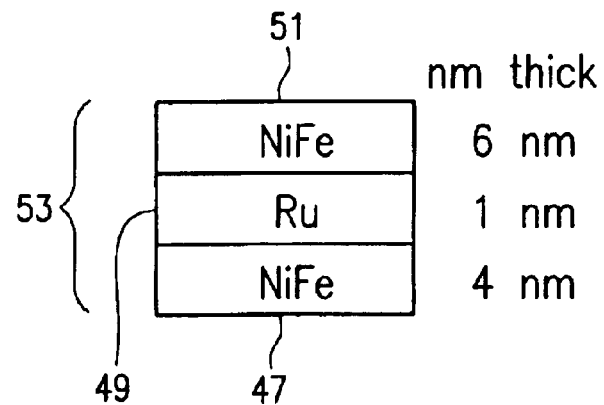
FIG. 5b shows a cross section view of a magnetic memory element sense layer constructed in accordance with an exemplary embodiment of the invention.
Figure 5C:
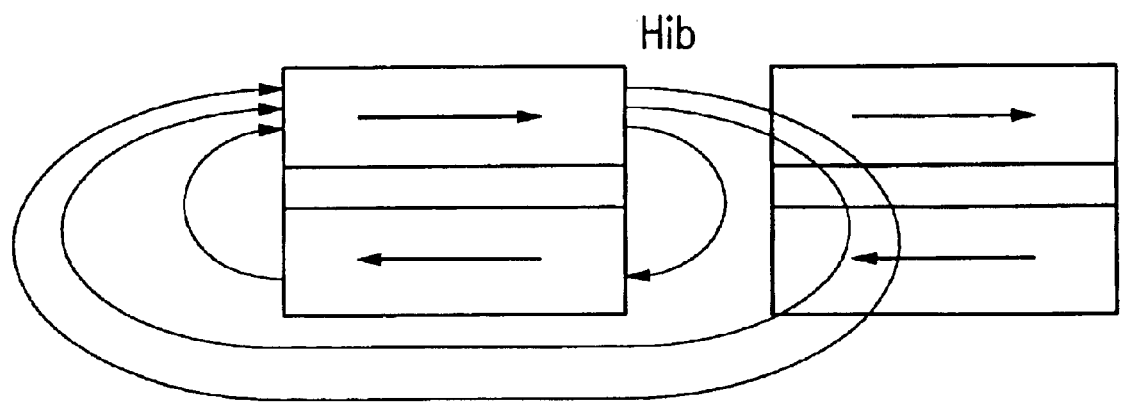
FIG. 5c shows a view of two neighboring bits with stray fields from one bit interacting with the neighboring bit.

FIG. 5a shows a calculation of the inter-bit stray field, Hib, at 150 nm emanating from an elliptical synthetic ferrimagnet sense layer 53 as a function of thickness if the bottom layer of the second ferromagnetic layer 47 is 4 nm thick. The inter-bit stray field Hib, is shown schematically in FIG. 5c. The sense layer 53 embodiment modeled in FIG. 5a comprises a ferromagnetic layer 55 formed from NiFe(6 nm), a spacer layer 49 and a ferromagnetic layer 51 formed of NiFe(4 nm). (See FIG. 5b) The spacer 49 material is a conducting metallic layer of between 0.5 and 2 nm thick and can be formed from Cu, Ru or alloys of various metals. Compared to a single layer sense layer, a synthetic ferrimagnetic sense layer would produce a smaller stray field at the location of a neighboring bit. Referring again to FIG. 5a, a 4 nm thick single layer bit would produce an interaction field at 150 nm from the bit end of 15 Oe. As the thickness of the top layer of the synthetic ferrimagnetic sense layer is increased, the stray field at the neighboring bit location decreases and then changes sign. As the top layer is made too thick, the interactions fields again become too large. Note that stray fields at the location of neighboring bits are greatly reduced when the top ferromagnetic layer 51 is deposited in the range of 2 nm to 6 nm. FIG. 5a shows that the resulting reduction in neighboring bit stray fields would allow magnetic memory bits to be spaced closer in an array 9 with reduced stray field interactions between neighboring bits 11. Using only Hd12 and Hd21 to antiferromagnetically couple layers 47 and 51 limits the range of relative layer thickness, which makes it difficult to produce a working sense layer that shows reduced inter-bit interactions.

Figure 6:
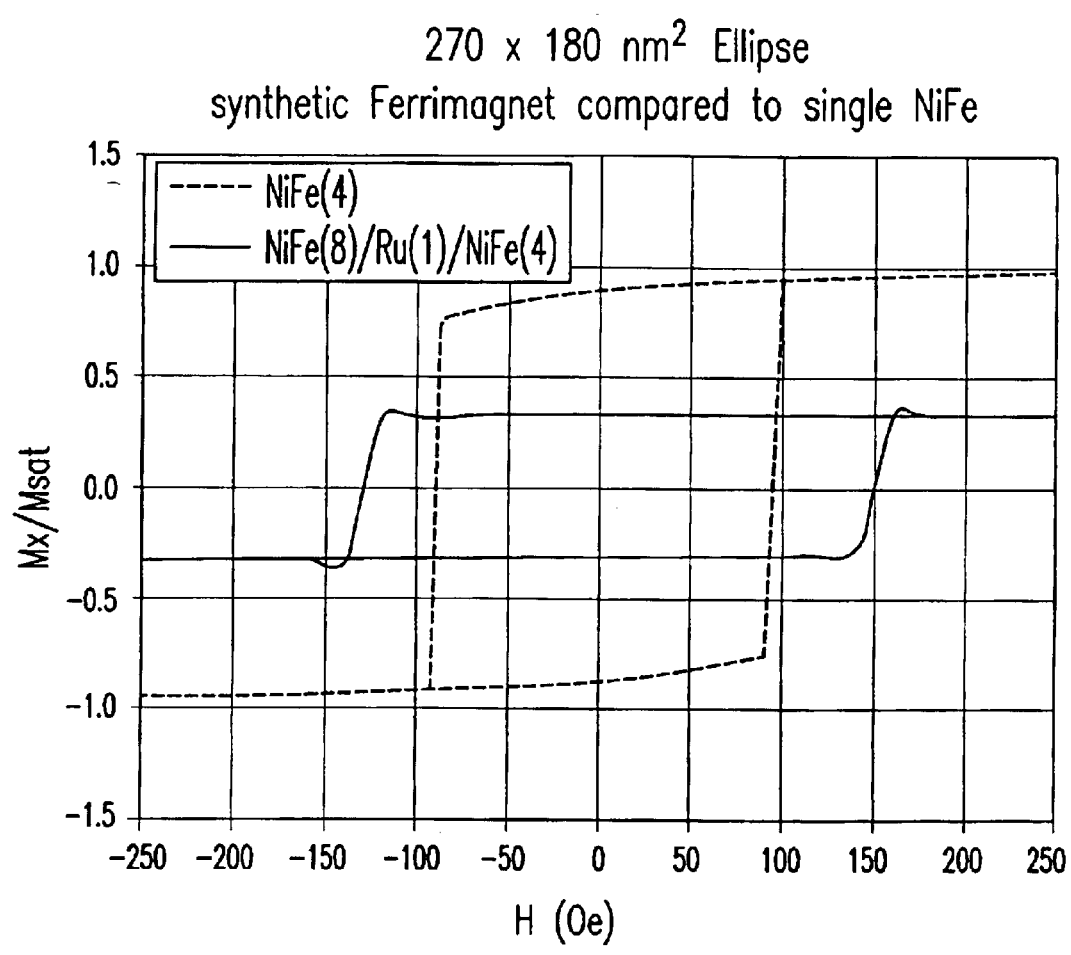
FIG. 6 shows a comparison of a magnetic hysteresis loop for a magnetic memory element constructed in accordance with an exemplary embodiment of the invention with a hysteresis loop for a sense layer without a synthetic ferrimagnet.

The improved thermal stability of a synthetic ferrimagnetic sense layer is demonstrated in FIG. 6. FIG. 6 shows a comparison of a hysteresis loop for a single 4 nm thick NiFe elliptically patterned sense layer (270 nm×180 nm) with a hysteresis loop for a synthetic ferrimagnet sense layer 53, similar to that shown in FIG. 5b, of the same dimension and shape computed using a micromagnetic calculation based on the Landau-Lifshitz-Gilbert equation. An alternative way to view thermal stability is to look at the energy required to write a bit. For an unselected bit, this energy may be expressed as E=½ Msat*Hc*V. Note that the coercive magnetic field (Hc) value of the synthetic ferrimagnet sense layer 53 is about 35% higher than the Hc value for the single layer film, and that the magnetic volume of the synthetic ferrimagnet is three times that of the single layer's magnetic volume. The increase in magnetic volume and Hc effectively increases the thermal stability factor by 1.35*3=4.05 times. Also, note that the required coercive field is not so large that it would require excessively high current to write a magnetic bit 11 sense layer 53.

Figure 7:
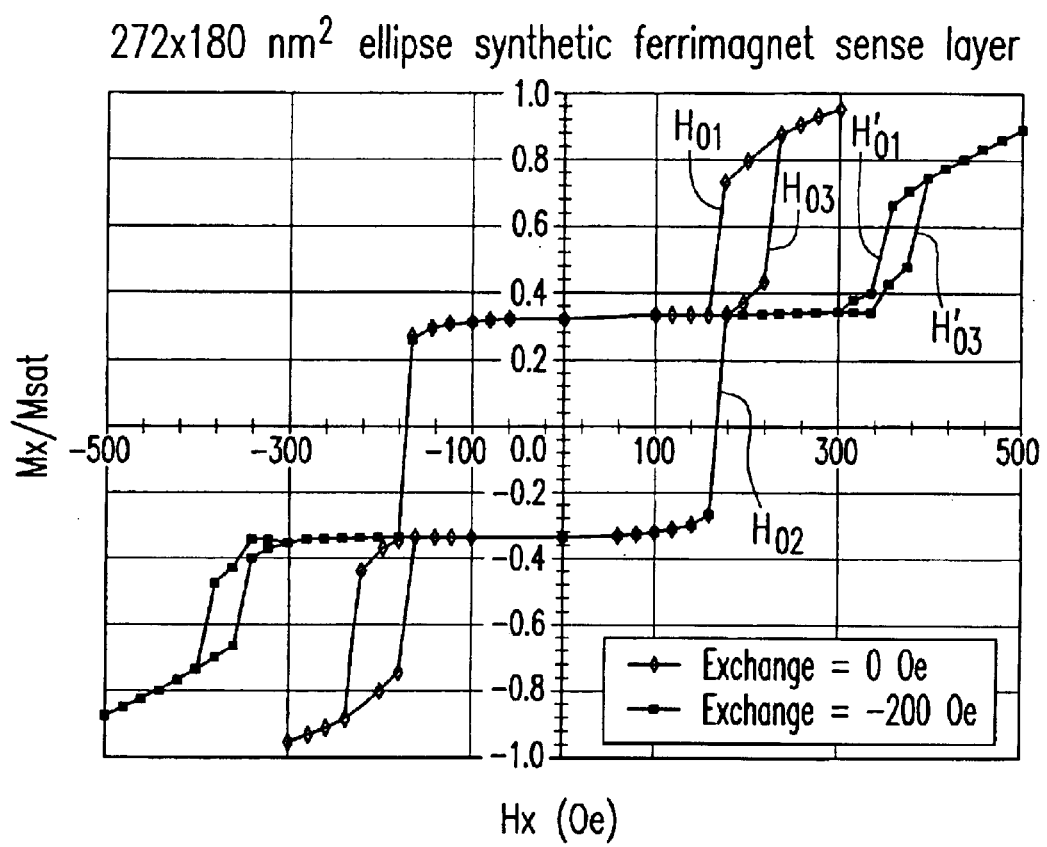
FIG. 7 shows a comparison of a magnetic hysteresis loop for a magnetic memory element sense layer constructed in accordance with an exemplary embodiment of the invention as compared to a hysteresis loop for a magnetic memory element sense layer without antiferromagnetic RKKY exchange coupling.

FIG. 7 shows a micromagnetic simulation of a synthetic ferrimagnetic sense layer with Hexc=0 Oe and Hexc=200 Oe. The comparison between the Hexc=0 Oe and the Hexc=200 Oe cases is made in order to show the advantage of including an antiferromagnetic exchange coupling between layers 47 and 51 in the synthetic ferrimagnetic sense layer 53. The vertical axis in FIG. 7 refers to the normalized magnetic moment of the synthetic ferrimagnetic sense layer, and the horizontal axis refers to the easy-axis write field. This type of plot is often referred to as a hysteresis or M(H) loop. Three H field values of interest are evident in each of the M(H) loops. The jump in the M(H) loops that occurs at the field H02 results when both layers 47 and 51 reverse directions simultaneously and thus remain oriented in opposite directions. The jump in M that occurs at the fields H01 and H03, results when one of the layers 47 or 51 changes direction independently of the other layer. The existence of the jumps at H01 and H03 imply that M1 and M2 can orient in the same direction when the sense layer is written with too strong a write field. The synthetic ferrimagnetic sense layer 53 will thus produce larger than desired stray fields Hib. Writing the bit at fields greater than H03 is therefore not desired. Further, it is possible that H01 may approach 0 Oe, in this case the synthetic ferrimagnetic sense layer is unstable, and can magnetize into several undesired states. The values H01, H02, and H03 all depend critically on the values of the parameters Msat1, Msat2, t1, t2, ts, Hc1, and Hc2. It should be noted that all other device parameters being the same, the inclusion of an antiferromagnetic exchange field increases the separation between fields H01 and H02 by moving the fields H01 and H03 to higher values. The antiferromagnetic exchange field also reduces the difference between H01 and H03, an effect which results in a more magnetically stable sense layer. Hexc thus allows greater freedom in synthetic sense layer optimization. If the condition H02<H01 is obeyed, it can be shown that a minimum value of Hexc that results in antiparallel orientation of M1 and M2 for all relevant write fields exists. Although it is difficult to solve for the condition analytically, it can be approximated as $|Hexc|$ is greater than approximately $((\frac{1}{2})*[Hc1-Hc2+Hd21-Hd12])$ Because Hexc can be used to stabilize an unstable synthetic ferrimagnetic sense layer design, a wider variation in the choice of Msat1, Msat2, t1, and t2 can be accommodated, resulting in the capability to build a sense layer with both improved thermal stability and reduced stray field, Hib.

Figure 8:
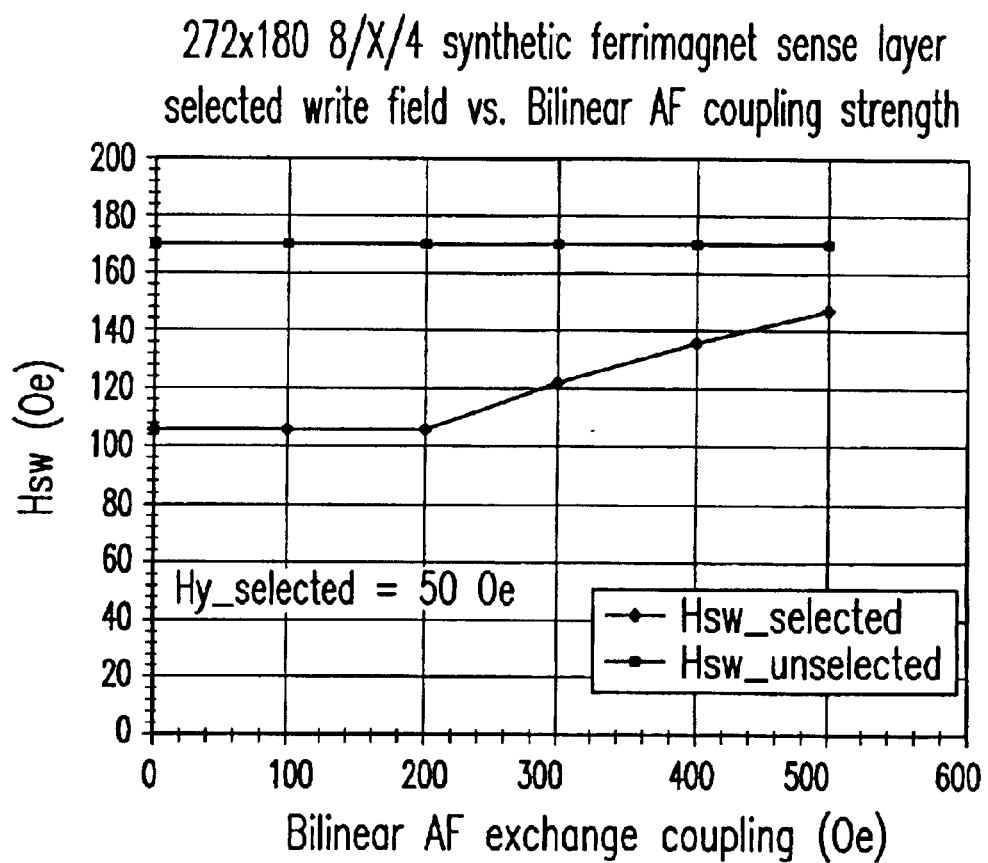
FIG. 8 shows a comparison of magnetic field intensity required to perform a write operation on a synthetic sense layer constructed in accordance with an exemplary embodiment of the invention when antiferromagnetic RKKY exchange coupling is varied.

Provided the minimum exchange coupling condition is met, the magnetic properties of the synthetic ferrimagnetic sense layer 53 will be stable over a large range of Hexc values. FIG. 8 is used to demonstrate the effect of varying Hexc. FIG. 8 is a plot of the write field Hsw for a 272 nm by 180 nm elliptical synthetic ferrimagnetic sense layer as a function of Hexc and the hard-axis bias field Hy_selected. The simulated stack is NiFe(8 nm)/Spacer/NiFe(4 nm), and it was chosen to allow the Hexc=0 Oe point to operate as a synthetic ferrimagnetic sense layer over the entire range of write fields, that is, for Hsw<H02. Referring to FIG. 8, write margin may be defined as the vertical distance between the Hsw_selected and Hsw_unselected curves. It is desirable to have a large write margin, since this allows the sense layer to be written at a field value that can be chosen to maximize bit yield in an MRAM array. It is evident from FIG. 8, that when Hexc<200 Oe, there is no change in write margin. As Hexc is increased above 200 Oe, write margin slowly decreases. At some large value of Hexc, write margin becomes zero, and the sense layer cannot be selected for writing without writing all bits located on the same column line. The upper limit in Hexc is strongly dependent on the parameters Msat1, Msat2, t1, t2, ts, Hc1, and Hc2, and it should be determined empirically for each device design. Hexc can be set by proper choice of spacer material, spacer thickness, Msat1, Msat2, t1, and t2.

Figure 9:
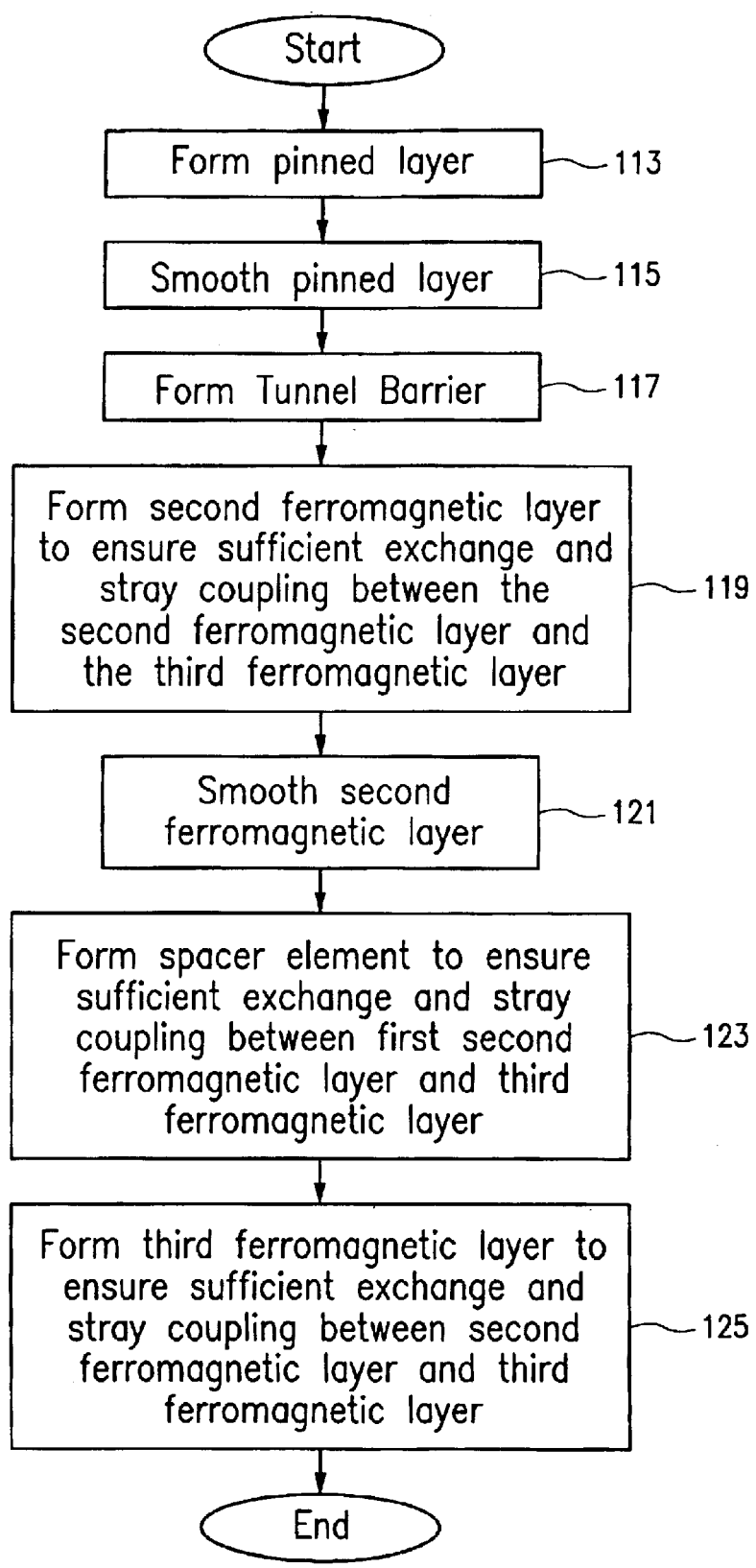
FIG. 9 shows a processing sequence for manufacturing a magnetic memory element in accordance with an exemplary embodiment the invention.

Referring to FIG. 9, one possible process for manufacturing an embodiment of the invention is disclosed. Note that the layers in the stack can also be inverted, which may result in a change in the process steps and possibly methods. In any case, first, the pinned or reference layer 43 is deposited at processing segment 113. The pinned layer 43 can be a coupled antiferromagnetic and ferromagnetic layer structure, a synthetic ferrimagnet, or an antiferromagnetic layer coupled to a synthetic ferrimagnetic stack. The pinned layer 43 materials can be selected from known materials, which are used for pinned layer 43 construction including FeMn, IrMn, PtMn, NiMn, or NiO. For a single layer pinned layer 43 or, in the case of a coupled antiferromagnetic and ferromagnetic layer, IrMn could be used for the antiferromagnetic layer and NiFe could be used for the ferromagnetic layer. Next, at processing segment 115, the pinned layer 43 is smoothed sufficiently by, for example, by sputtering etching or other technique to reduce the magnetic field coupling caused by layer surface irregularities (Neel coupling). At processing segment 117, a thin tunnel barrier layer 45 is deposited. The tunnel barrier may be selected from known materials including alumina ($Al_2O_3$). In processing segment 119, the second ferromagnetic layer 47 is formed from ferromagnetic materials, such as NiFe, so that sufficient antiferromagnetic exchange coupling and stray field 71, 73 coupling is present between the second ferromagnetic layer 47 and the desired third ferromagnetic layer 51 which will be subsequently deposited. Finally, and depending on the choice of materials, the entire stack should be annealed in the presence of a magnetic field, in order to set the correct magnetization orientations for the various layers.

Sufficient antiferromagnetic exchange coupling refers to a sense layer 53 design which provides for antiferromagnetic exchange coupling between the second ferromagnetic layer 47 and the desired third ferromagnetic layer 51 (subsequently formed) such that the antiferromagnetic exchange coupling is more than zero and less than a value which requires a significantly increased magnetic switching field intensity (Hsw) after a certain point of antiferromagnetic exchange coupling of layers 47 and 51 across spacer layer 47.

As FIG. 8 indicates, given a specified synthetic ferrimagnet dimension and materials, after a certain point of antiferromagnetic exchange coupling (e.g., −200 Oe), the applied magnetic field (Hx) required to perform a write operation must be increased thereby increasing the current required to perform switching of the sense layer 53 magnetic moment 75, 77 orientations. At some point, when Hexc is too strong, a hard-axis bias (at 90 degrees to the easy axis 19) will not be sufficient to write the magnetic memory bit (11) sense layer 53 (switch the orientation of the sense layer 53 magnetic moments 77, 75).

Next, the second ferromagnetic layer 47 may be smoothed to reduce Neel coupling (magnetic coupling between layers 47 and 51 caused by interfacial irregularities) in processing segment 121. In processing segment 123, the spacer element 49 is formed from materials for spacer layers which permit antiferromagnetic exchange coupling including Ru, Cr or Cu, such that sufficient antiferromagnetic exchange coupling and stray field coupling is present across spacer layer 49 between the second ferromagnetic layer 47 and the desired third ferromagnetic layer 51. In processing segment 125, the third ferromagnetic layer 51 is formed from ferromagnetic materials, e.g. NiFe, on top of the spacer layer 49 so that sufficient antiferromagnetic exchange coupling and stray field coupling is present across spacer layer 49 between the second ferromagnetic layer 47 and the third ferromagnetic layer 51. Again, it is important to note that the antiferromagnetic exchange coupling attribute is dependent upon magnetic memory bit 11 design including sense layer design, bit size and materials and thus may be varied to achieve the desired effect of sufficient antiferromagnetic exchange coupling and magnetic moment switching point separation in the sense layer 53.

Figure 10:
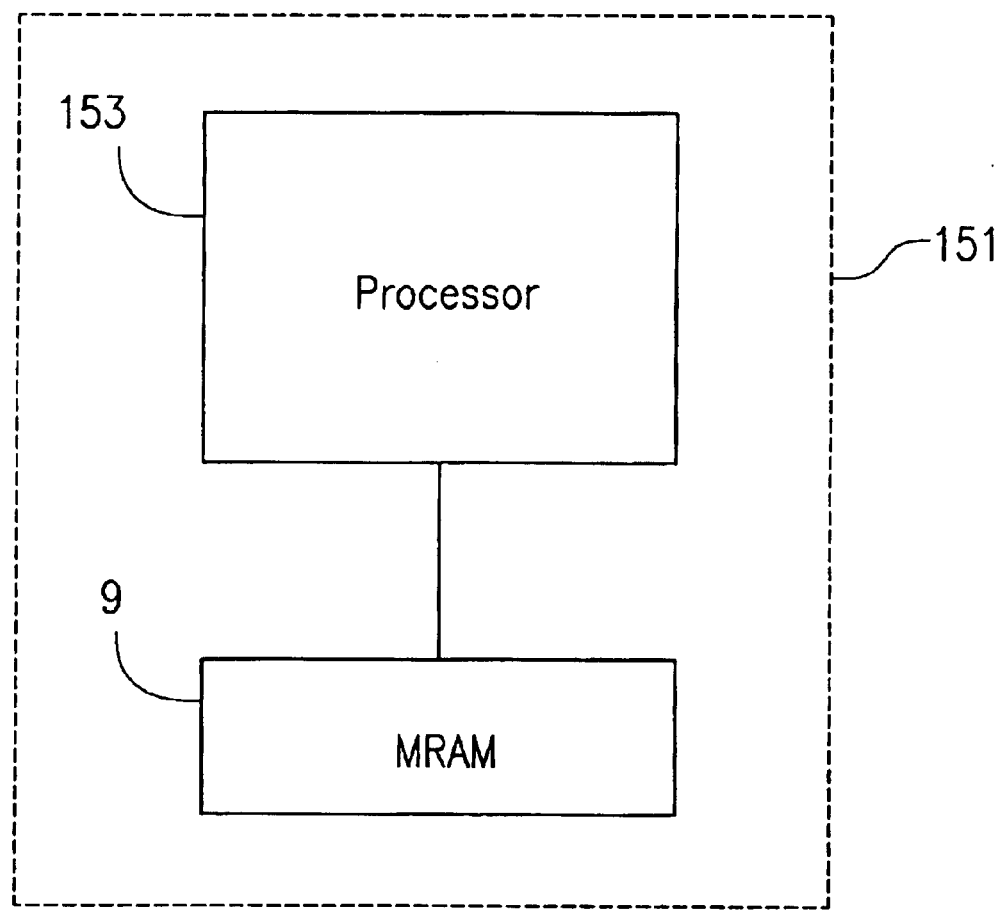
FIG. 10 shows a processor system incorporating MRAM memory devices having memory elements constructed in accordance with an exemplary embodiment of the invention.

FIG. 10 shows a processor system 151 comprising a MRAM memory array 9 comprised of magnetic memory bits 11 constructed in accordance with an embodiment of the present invention, coupled with a processor, e.g., a central processor unit 153 for data exchange. The magnetic memory bits 11 are electrically coupled to the processor 151 so as to permit reading and writing data to and from the memory bits 11. The magnetic memory bits 11 may be coupled to the processor 151 through a memory controller and bus system not pictured or coupled with other components through another data transfer architecture.

Reference is made to various specific embodiments of the invention. These embodiments are described with sufficient detail to enable those skilled in the art to practice the invention. It is to be understood that other embodiments of the invention may be employed and that structural and electrical changes may be made without departing from the scope or spirit of the present invention.

What is claimed is:

1. A method for manufacturing a magnetic memory element comprising:
    forming a pinned layer with a magnetization in a first direction supported by a substrate;
    forming a tunnel barrier layer adjacent the pinned layer; and
    forming a sense layer adjacent a side of the tunnel barrier layer opposite the pinned layer, said sense layer having a first ferromagnetic layer and a second ferromagnetic layer mutually separated by a conductive spacer layer and a characteristic which results in stray field coupling and antiferromagnetic exchange coupling between said first and second ferromagnetic layers.

2. A method of claim 1 wherein the act of forming said sense layer further comprises:
    forming said first ferromagnetic layer over the tunnel barrier layer;
    forming said conductive spacer layer over the first ferromagnetic layer; and forming the second ferromagnetic layer over the conductive spacer layer.

3. A method of claim 2 further comprising smoothing a surface of the pinned layer before forming another layer on said pinned layer.

4. A method of claim 2 further comprising smoothing the first ferromagnetic layer before forming said conductive spacer layer.

5. A method of claim 2 wherein said first and second ferromagnetic layers are formed of a material comprising NiFe.

6. A method of claim 2 wherein said first and second ferromagnetic layers are formed of a material comprising CoFe.

7. A method of claim 2 wherein said first and second ferromagnetic layers are formed of a material comprising Co.

8. A method of claim 2 wherein said first and second ferromagnetic layers are formed of a material comprising Fe.

9. A method of claim 2 wherein said first and second ferromagnetic layers are formed of a material comprising Ni.

10. A method of claim 2 wherein said first and second ferromagnetic layers are formed of a material comprising NiFeCo.

11. A method of claim 2 wherein said conductive spacer layer comprises a Ru layer.

12. A method of claim 2 wherein said conductive spacer layer comprises a Cu layer.

13. A method of claim 2 wherein said conductive spacer is a conductor that is not ferromagnetic or antiferromagnetic.

14. A method of claim 2 wherein said conductive spacer layer is formed with a thickness such that the antiferromagnetic exchange coupling between said first and second ferromagnetic layers is less than the coercive (H) field value of the one of the first or second ferromagnetic layers which has the largest coercive field value.

15. A method of claim 2 where forming said layers is such that the layers are formed of a material and thickness sufficient to provide stray field coupling and antiferromagnetic exchange coupling, said antiferromagnetic exchange coupling is within the range of greater than 0 to <=200 Oe between the first and second ferromagnetic layers across said conductive spacer layer.

16. A method of claim 2 wherein said step of forming the first and second ferromagnetic layers includes forming said first and second ferromagnetic layers including NiFe.

17. A method of claim 2 wherein second layer is formed with a thickness t and first layer is formed with a thickness greater than t.

18. A method of claim 2 further comprising:
   forming a thinner layer, relative to the first ferromagnetic layer, of Co interposed between the conductive spacer layer and the first ferromagnetic layer; and
   forming a thinner layer, relative to the second ferromagnetic layer, of Co interposed between the conductive spacer layer and the second ferromagnetic layer.

19. A method of claim 2 further comprising:
   forming a thinner layer, relative to the first ferromagnetic layer, of CoFe interposed between the conductive spacer layer and the first ferromagnetic layer; and
   forming a thinner layer, relative to the second ferromagnetic layer, of CoFe interposed between the conductive spacer layer and the second ferromagnetic layer.

20. A method for manufacturing a magnetic memory element comprising:
   forming a sense layer, said sense layer having a first ferromagnetic layer and a second ferromagnetic layer mutually separated by a conductive spacer layer and a characteristic which results in stray field coupling and antiferromagnetic exchange coupling between said first and second ferromagnetic layers across said conductive spacer layer;
   forming a tunnel barrier layer adjacent the sense layer; and
   forming a pinned layer with a magnetization in a first direction adjacent a side of said tunnel barrier opposite said sense layer.

21. A method of claim 20 wherein the act of forming said sense layer further comprises:
   forming said first ferromagnetic layer over the tunnel barrier layer;
   forming a conductive spacer layer over the first ferromagnetic layer; and
   forming the second ferromagnetic layer over the conductive spacer layer.

22. A method of claim 20 wherein said conductive spacer layer is formed with a thickness such that the antiferromagnetic exchange coupling between said first and second ferromagnetic layers is less than the coercive (H) field value of the one of the first or second ferromagnetic layer which has the largest coercive field value.

23. A method of claim 20 where forming said layers is such that the layers are formed of a material and thickness sufficient to provide stray field coupling and antiferromagnetic exchange coupling, said antiferromagnetic exchange coupling is greater than 0 and <=200 Oe between the first and second ferromagnetic layers across said conductive spacer layer.

24. A method of claim 20 wherein second ferromagnetic layer is formed with a thickness t and first ferromagnetic layer is formed with a thickness greater than t.

25. A method for manufacturing a magnetic memory element comprising:
   forming a pinned layer with a magnetization in a first direction over a substrate;
   smoothing a surface of the pinned layer;
   forming a tunnel barrier layer over the pinned layer; and
   forming a sense layer over the tunnel barrier layer, said act of forming said sense layer comprising:
   forming a first magnetization layer over the tunnel barrier layer;
   smoothing the first magnetization layer;
   forming a spacer layer over the first magnetization layer;
   forming a second magnetization layer over of the spacer layer;
   said first and second magnetization layers and spacer layer being formed such that said layers are stray field coupled and antiferromagnetic exchange coupled across said spacer layer;
   said first and second magnetization layers being formed such that said first layer has a magnetic saturation times said first layer thickness not equal to said second layer magnetic saturation times said second layer thickness.

26. A method of claim 25 wherein said spacer layer is formed with a thickness such that the antiferromagnetic exchange coupling between said first and second magnetization layers is less than the coercive (H) field value of the one of the first or second magnetization layer which has the largest coercive field value.

27. A method of claim 25 wherein sense layer is formed having antiferromagnetic exchange coupling between first and second magnetization layers of more than zero and less than a value which prevents magnetic orientation switching of said sense layer in the presence of an applied magnetic field.

28. A method of claim 25 wherein said first magnetization layer, spacer layer and second magnetization layer are formed of materials and and have thickness sufficient to provide stray field coupling and antiferromagnetic exchange coupling between said first and second magnetization layers and across said spacer layer, said antiferromagnetic exchange coupling is greater than 0<=200 Oe.

29. A method of claim 25 wherein the second magnetization layer is formed with a thickness t and first layer is formed with a thickness greater than t.

30. A method for manufacturing a magnetic memory element comprising:
 forming a pinned layer with a magnetization in a first direction over a substrate;
 forming a conductive layer adjacent the pinned layer for creating a giant magnetoresistance effect; and
 forming a sense layer on a side of the conductive layer opposite the pinned layer, said sense layer having a first and second ferromagnetic layers mutually separated by a conductive spacer layer and a characteristic which results in stray field coupling and antiferromagnetic exchange coupling between said first and second ferromagnetic layers.

31. A method of claim 30, wherein the act of forming said sense layer further comprises:
 forming said first ferromagnetic layer over the conductive layer;
 forming a conductive spacer layer over the first ferromagnetic layer; and
 forming the second ferromagnetic layer over the conductive spacer layer.

32. A method of claim 30, wherein forming said layers is such that the layers are formed of a material and have a thickness sufficient to provide stray field coupling and antiferromagnetic exchange coupling, said antiferromagnetic exchange coupling is within the range of greater than 0 to <=200 Oe between the first and second ferromagnetic layers across said conductive spacer layer.

33. A method of claim 30, wherein the second ferromagnetic layer is formed with a thickness t and the first layer is formed with a thickness greater than t.

34. A method of claim 30, wherein said pinned or reference layer is a synthetic ferrimagnet.

* * * * *

UNITED STATES PATENT AND TRADEMARK OFFICE
CERTIFICATE OF CORRECTION

PATENT NO. : 6,946,302 B2
DATED : September 20, 2005
INVENTOR(S) : Deak

It is certified that error appears in the above-identified patent and that said Letters Patent is hereby corrected as shown below:

Column 5,
Line 10, "embodiment the" should read -- embodiment of the --;

Column 6,
Line 65, "is type" should read -- is a type --;

Column 7,
Lines 55-56, "Ruderman-Kittel-Yasuya-Yoshida" should read -- Ruderman-Kittel-Kasuya-Yoshida --;

Column 8,
Lines 42 and 43, "HDI2" should read -- HD12 --.

Column 9,
Line 18, "HDI2" should read -- HD12 --.

Column 14,
Line 50, "over of the" should read -- over the --.

Signed and Sealed this

Thirteenth Day of December, 2005

JON W. DUDAS
*Director of the United States Patent and Trademark Office*